United States Patent
Golding

(10) Patent No.: US 9,520,986 B2
(45) Date of Patent: Dec. 13, 2016

(54) METHOD AND APPARTUS FOR EXCHANGING DATA BETWEEN DEVICES OPERATING AT DIFFERENT CLOCK RATES

(75) Inventor: John M. Golding, Naperville, IL (US)

(73) Assignee: Coriant Operations, Inc., Naperville, IL (US)

( * ) Notice: Subject to any disclaimer, the term of this patent is extended or adjusted under 35 U.S.C. 154(b) by 2314 days.

(21) Appl. No.: 12/454,153

(22) Filed: May 13, 2009

(65) Prior Publication Data
US 2010/0244913 A1 Sep. 30, 2010

Related U.S. Application Data

(60) Provisional application No. 61/164,878, filed on Mar. 30, 2009.

(51) Int. Cl.
| | | |
|---|---|---|
| *H04L 7/00* | (2006.01) | |
| *H04L 7/10* | (2006.01) | |
| *G06F 1/12* | (2006.01) | |
| *H04L 7/04* | (2006.01) | |

(52) U.S. Cl.
CPC ............ *H04L 7/0008* (2013.01); *G06F 1/12* (2013.01); *H04L 7/10* (2013.01); *H04L 7/043* (2013.01)

(58) Field of Classification Search
CPC ........... H04B 1/38; H04B 1/3827; H04B 1/40; H04B 1/50; H04B 1/54; H04L 7/00; H04L 7/0008; H04L 7/0012; H04L 7/0016; H04L 7/0054; H04L 7/043; H04L 7/06; H04L 7/10; G06F 1/04; G06F 1/06; G06F 1/10; G06F 1/12
USPC ............... 375/373, 376, 219, 220, 222, 257, 259,375/260, 354, 356; 348/222.1, 234, E7.003, 348/E7.008; 365/189.011, 189.2, 233.11; 345/530, 537, 538; 370/278, 282, 503; 455/73, 88
See application file for complete search history.

(56) References Cited

U.S. PATENT DOCUMENTS

| | | | | |
|---|---|---|---|---|
| 5,408,266 A | * | 4/1995 | Ikeyama et al. | 348/222.1 |
| 5,999,032 A | * | 12/1999 | Wang et al. | 327/292 |
| 6,307,877 B1 | | 10/2001 | Philips et al. | |
| 6,414,983 B1 | | 7/2002 | Koga et al. | |
| 6,667,666 B2 | | 12/2003 | Uzunoglu | |
| 6,747,987 B1 | | 6/2004 | Meador et al. | |
| 7,043,211 B1 | | 5/2006 | Waight et al. | |
| 7,139,293 B1 | * | 11/2006 | Essen | 370/545 |
| 7,190,754 B1 | * | 3/2007 | Chang et al. | 375/373 |
| 7,199,634 B2 | * | 4/2007 | Cho et al. | 327/175 |
| 7,209,397 B2 | * | 4/2007 | Ware et al. | 365/194 |
| 7,966,439 B1 | * | 6/2011 | Treichler et al. | 710/306 |
| 2004/0170072 A1 | * | 9/2004 | Ware et al. | 365/200 |
| 2008/0130811 A1 | * | 6/2008 | Bae et al. | 375/355 |
| 2008/0303576 A1 | * | 12/2008 | Chueh et al. | 327/299 |
| 2009/0103572 A1 | * | 4/2009 | Zerbe | 370/503 |
| 2009/0323880 A1 | * | 12/2009 | Filer | 375/376 |
| 2010/0180143 A1 | * | 7/2010 | Ware et al. | |

* cited by examiner

*Primary Examiner* — Young T Tse
(74) *Attorney, Agent, or Firm* — Hamilton, Brook, Smith & Reynolds, P.C.

(57) ABSTRACT

Source-synchronous communications between networked devices can be hindered by differing clock rates and data interface formats among the devices. By implementing a plurality of clock converters, a data interface format of a transmitting device is converted to a data interface format compatible with a receiving device. The clock converters provide a clock signal based on the source-synchronous data clock, and having a phase controlled with respect to an associated data signal. As a result, data exchange between devices operating at different clock rates is made possible.

18 Claims, 7 Drawing Sheets

METHOD AND APPARTUS FOR EXCHANGING DATA BETWEEN DEVICES OPERATING AT DIFFERENT CLOCK RATES

RELATED APPLICATION(S)

This application claims the benefit of U.S. Provisional Application No. 61/164,878, filed on Mar. 30, 2009. The entire teachings of the above application(s) are incorporated herein by reference.

BACKGROUND OF THE INVENTION

A number of different data transmission protocols are in commercial use. While switching systems dedicated to particular protocols are common, it has been more difficult to produce general switching systems that are able to switch multiple protocols. This is partially due to the diverse formats used by the various protocols.

Digital loop carrier (DLC) systems utilize fiber-optic distribution links and remote multiplexing devices to deliver voice and data signals to and from the local users. In a typical DLC system, a fiber optic cable is routed from the central office terminal (COT) to a host digital terminal (HDT) located within a particular neighborhood. Telephone lines from subscriber homes are then routed to circuitry within the HDT, where the telephone voice signals are converted into digital pulse-code modulated (PCM) signals, multiplexed together using a time-slot interchanger (TSI), converted into an equivalent optical signal, and then routed over the fiber optic cable to the central office. Likewise, telephony signals from the central office are multiplexed together, converted into an optical signal for transport over the fiber to the HDT, converted into corresponding electrical signals at the HDT, demultiplexed, and routed to the appropriate subscriber telephone line twisted-pair connection.

In some communications systems or networks, such as a network core transport system supporting a digital loop carrier (DLC) system or other communications network, a device may transmit or receive communications signals with an associated clock in a source-synchronous manner.

SUMMARY OF THE INVENTION

Example embodiments of the present invention provide methods and apparatuses for converting a data interface format to enable data exchange between devices operating at different clock rates. A clock up-converter derives an up-converted clock signal from a first clock signal of a first device. The up-converted clock signal is provided to a second device, and has a phase controlled with respect to a phase of an associated first data signal from the first device. Further, a clock down-converter derives a down-converted clock signal from a second clock signal of the second device. The down-converted clock signal is provided to the first device and has a phase controlled with respect to a phase of an associated second data signal from the second device.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

A source-synchronous single-data rate (SDR) device provides a data signal output and a data clock output, where the data signal output is controlled such that each data segment is coincident with a rising edge of the associated data clock. Alternatively, the data signal can be coincident with a falling edge of the data clock. The SDR device may receive data with an associated clock in a similar manner. Likewise, a source-synchronous double-data rate (DDR) device provides a data signal output that is controlled such that both the rising and falling edges of a data clock are coincident with a data segment. Thus, the DDR device can transmit and receive data at a rate that is double that of an SDR device operating at the same clock frequency.

Figure 1A:
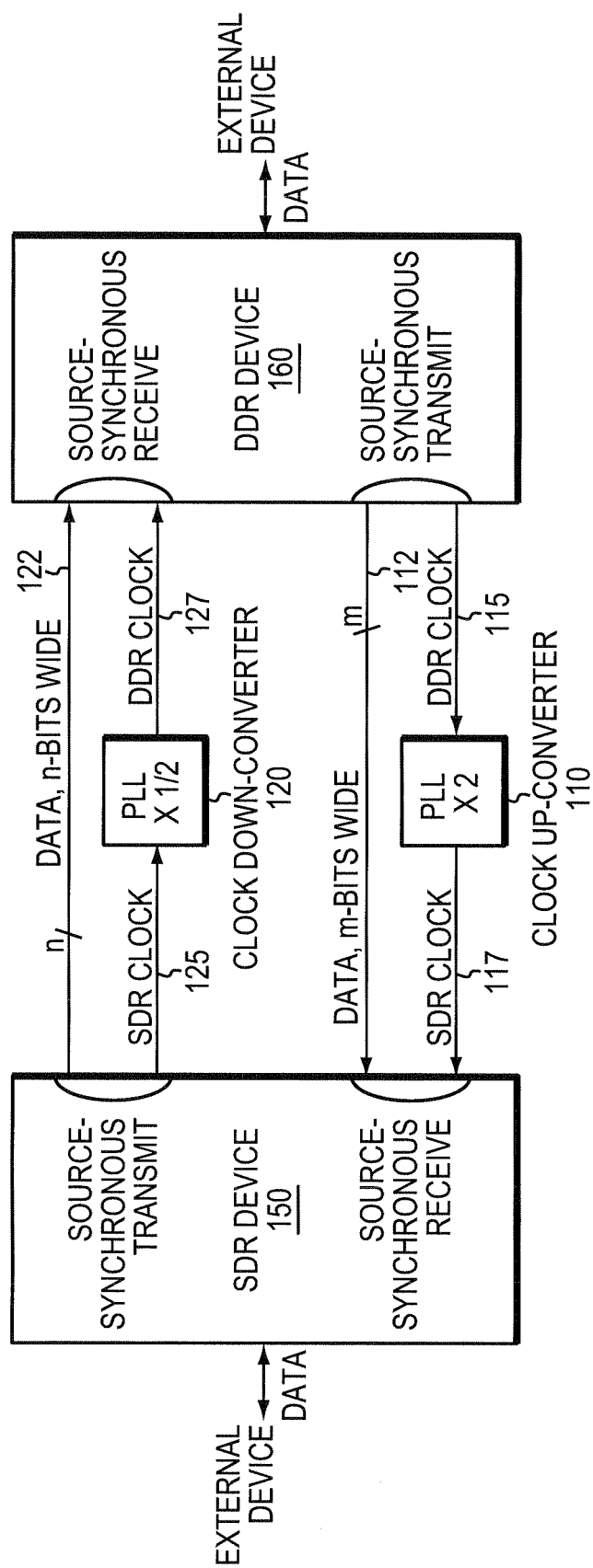
FIG. 1A is a block diagram of a data interface between two devices incorporating an embodiment of the present invention.

FIG. 1A is a block diagram of a pair of devices 150, 160 configured for source-synchronous communications employing an embodiment of the present invention. A single-data rate (SDR) device 150 transmits a data signal 122 (serially or in parallel transmission n-bits wide) in a manner synchronous with an associated SDR clock signal 125. The SDR device 150 is also configured to receive a data signal 112 in a source-synchronous manner, where the data input is clocked by an associated SDR clock input signal 117. In providing a source-synchronous SDR clock, each segment of the data signals 122, 112 are coincident with each rising edge of the respective SDR clock 125, 117. Alternatively, the data signals may be coincident with each falling edge of the respective SDR clock signal 125, 117. The SDR device 150 thus transmits and receives data at a rate equal to the frequency of the associated clock signals 125, 117. The SDR device 150 may, in turn, communicate with an external device (not shown) to transmit and receive data corresponding to the data signals 122, 112. For example, the SDR device 150 may be configured at a network core transport system, and may exchange data with an optical line terminal (OLT) (not shown) supporting an optical network service. In such a configuration, the SDR device 150 may operate as a serializer/deserializer with respect to the parallel data signals 122, 112 and support a serial data exchange with the OLT.

A double-data rate (DDR) device 160 transmits the data signal 112 (serially or in parallel transmission m-bits wide) in a manner synchronous with an associated DDR clock signal 115. The DDR device 160 is also configured to receive the data signal 122 in a source-synchronous manner, where the data input is clocked by an associated DDR clock input signal 127. In providing a source-synchronous DDR clock, both the rising and falling edges of the DDR clocks 115, 127 are coincident with a segment of the associated data signals 112, 122. As a result, the DDR device 160 transmits and receives data at a rate equal to double the frequency of the associated clock signals 115, 127. The DDR device 160 may, in turn, communicate with an external device (not shown) to transmit and receive data corresponding to the data signals 122, 112. For example, the DDR device 160 may be configured at a network core transport system, and may exchange data with one or more network switching modules (not shown) to provide communications with an external network (not shown). In such a configuration, the DDR device 160 may operate as a multiplexer/demultiplexer with respect to the data signals 122, 112 and support communications with the network switching modules.

Due to the SDR device 150 and the DDR device 160 communicating at different rates according to their respective clock signals, communications between the devices may not be compatible. For example, the SDR device 150 and the DDR device 160 may both be configured to transmit and receive data at a rate of 622 Mb/second. The SDR device 150 therefore transmits the SDR 125 clock at 622 MHz, and anticipates receiving the SDR clock input 117 at 622 MHz. In contrast, the DDR device 160 transmits the DDR clock output 115 at 311 MHz, and anticipates receiving the DDR clock input 127 at 311 MHz. Because the devices 150, 160 provide and receive source-synchronous clocks at different frequencies, the clock signal provided by one device cannot be used to clock data at the other device.

Embodiments of the present invention provide for converting a data interface format to enable data exchange between devices operating at different clock rates. To accomplish this conversion, in one example embodiment, a pair of phase-locked loops (PLLs) are configured to operate as a clock up-converter 110 and a clock down-converter 120, respectively. The clock up-converter 110, which may employ a multiplier, receives the DDR clock signal 115 from the DDR device 160 and derives the up-converted SDR clock signal 117. The up-converted SDR clock signal 117 is provided to the SDR device 150 and has a phase controlled with respect to a phase of an associated data signal 112. The clock down-converter 120, which may include a divider, receives the SDR clock signal 125 from the SDR device 150 and derives the down-converted DDR clock signal 127. The down-converted DDR clock signal 127 is provided to the DDR device 160 and has a phase controlled with respect to a phase of an associated data signal 122. As a result, both the DDR device 160 and the SDR device 150 receive clock signals that correspond with respective data input signals, enabling source-synchronous communications between the devices 150, 160.

Embodiments of the invention may provide for converting a data interface format consistent with a particular communications protocol. For example, devices may communicate with one another under OC-192 (synchronous optical networking (SONET) protocol), STM-64, 10 GBase-W, 10 Gbase-R, OTU2, OTU1e, OTU2e, or other protocols. Communications under such protocols may be supported by a parallel data interface. Accordingly, embodiments of the invention may be configured to convert a data interface format having a plurality of parallel data lines to enable source synchronous data exchange between devices operating at different clock rates. Further embodiments of the invention may be configured or reconfigured to provide for converting a data interface format consistent with a plurality of different communications protocols. For example, a clock up-converter and clock down-converter previously configured to convert clock signals associated with a data transmission under a 10 GBase-W protocol (a 9.953 Gbps line rate across a 16-bit wide parallel data line at 622 Mbps) may be reconfigured to convert clock signals associated with data transmission under a 10 GBase-R protocol (a 10.3125 Gbps line rate).

Figure 1B:
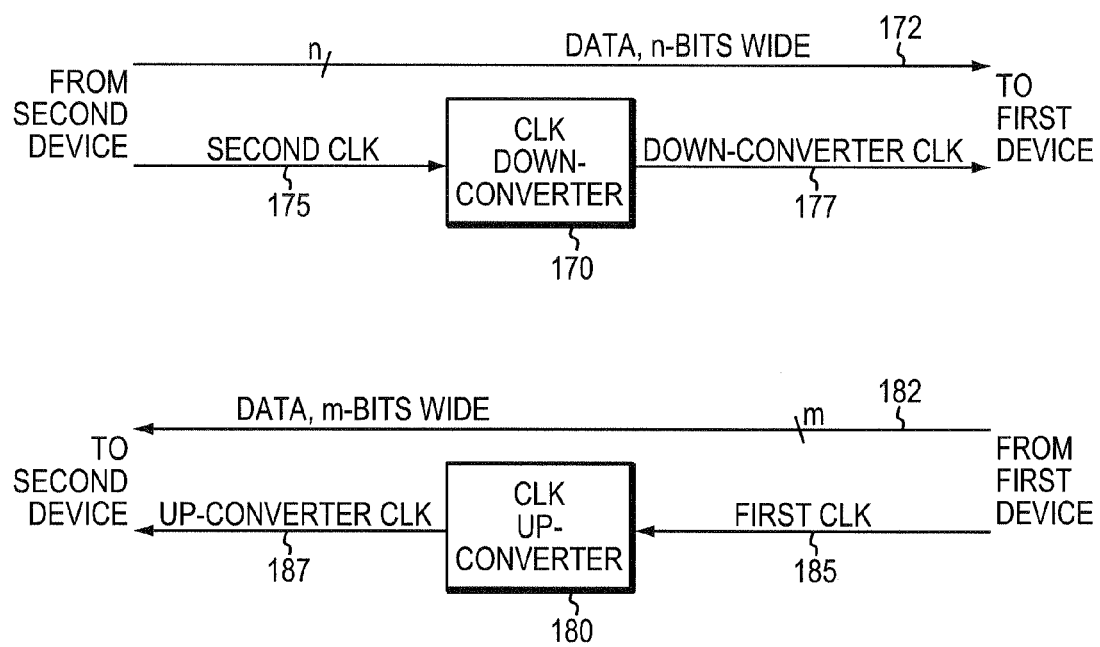
FIG. 1B is a block diagram of a plurality of clock converters.

FIG. 1B is a block diagram of a pair of clock converters 170, 180 that may be implemented in embodiments of the present invention. The clock converters 170, 180 may be configured in a manner comparable to the clock converters 110, 120 described above with reference to FIG. 1A. A clock up-converter 180 derives an up-converted clock signal 187 from a first clock signal 185 of a first device (not shown). The up-converted clock signal 187 is provided to a second device (not shown), and has a phase controlled with respect to a phase of an associated first data signal 182. Further, a clock down-converter 170 derives a down-converted clock signal 177 from a second clock signal 175 of the second device. The down-converted clock signal 177 is provided to the first device and has a phase controlled with respect to a phase of an associated second data signal 172.

In further embodiments of the invention, a controller (not shown) may be configured to generate control signals to control the respective phases of the up-converted and down-converted clock signals based on relative phases of the clock signals with respect to the associated data signal. An additional controller (an alignment controller), not shown, may be configured to align the up-converted and down-converted clock signals with the associated data signals at startup of the first and second devices by causing the devices to transmit alignment patterns and adjust phases of derived clock signals as a function of the alignment patterns. The alignment controller may be configured to enable functions of the first and second devices associated with the clock signals if alignment is achieved. In an event of a failure to achieve alignment, the alignment controller may be configured to report the failure and maintain the first and second devices in a pre-determined state to limit or withhold communications between the devices. The alignment pattern may be a pseudorandom pattern or other pattern. Further, the alignment controller may be configured to invert the phase of at least one of the up-converted and down-converted clock signals to align a leading or trailing edge with a feature of the respective first or second data signal.

In still further embodiments of the invention, the clock up-converter and the clock down-converter may each employ a phase-locked loop (PLL). The PLL employed by the up-converter may include a multiplier, and the PLL employed by the down-converter may include a divider. The first device may be a double-data rate (DDR) device, and the second device may be a single-data rate (SDR) device.

Figure 2:
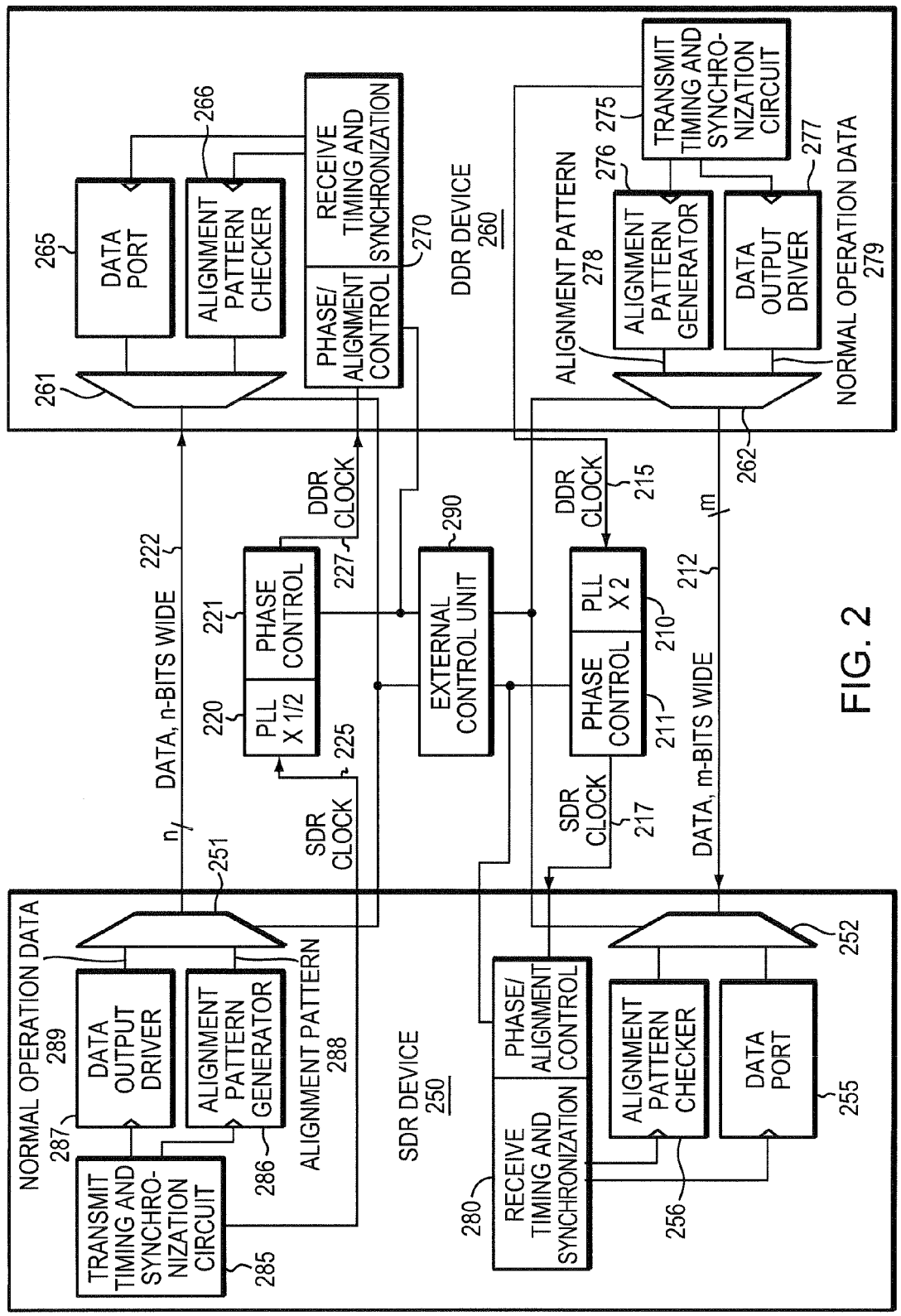
FIG. 2 is a block diagram of a single-data rate (SDR) device communicatively coupled to a double-data rate (DDR) device and implementing an embodiment of the present invention.

FIG. 2 is a block diagram of devices, including a single-data rate (SDR) device 250 communicatively coupled to a double-data rate (DDR) device 260, implementing an embodiment of the present invention. The devices 250, 260 and respective interfaces may be configured in a manner comparable to the respective elements described above with respect to FIGS. 1A and 1B.

The SDR device 250 transmits a data output signal 222 according to a data output selected by a multiplexer 251. The multiplexer 251 selects between normal operation data 289 provided by a data output driver 287 and an alignment pattern 288 output by an alignment pattern generator 286. An external control unit 290 determines which output 288, 289 the multiplexer 251 selects. A timing and synchronization circuit 285 provides an SDR clock signal 225 and clocks the data output driver 287 and alignment pattern generator 286, thereby controlling the data signal 222 to coincide with the SDR clock 225 in a source-synchronous manner.

The SDR device 250 further receives a data input signal 212 to a demultiplexer 252. The data signal 212 is received either by an alignment pattern checker 256, being logic configured to evaluate a received alignment pattern, or by a data port 255 for receiving normal operation data. An external control unit 290 determines which unit will receive the data signal 212, as described below. A timing controller 280 clocks both the alignment pattern checker 256 and the data port 255 responsive to a received SDR clock signal 217.

The DDR device 260 transmits a data output signal 212 according to a data output selected by a multiplexer 262. The multiplexer 262 selects between normal operation data 279 provided by a data output driver 277, and an alignment pattern 278 generated by an alignment pattern generator 276. The external control unit 290 determines which data 278, 279 the multiplexer 262 selects. A timing and synchronization circuit 275 provides a DDR clock signal 215 and clocks the data output driver 277 and alignment pattern generator 276, thereby controlling the data signal 212 to coincide with the DDR clock 215 in a source-synchronous manner.

The DDR device 260 further receives a data input signal 222 to a demultiplexer 261. The data signal 222 is received either by an alignment pattern checker 266, being logic configured to evaluate a received alignment pattern, or by a data port 265 for receiving normal operation data. An external control unit 290 determines which unit will receive the data signal 222, as described below. A timing controller 270 clocks both the alignment pattern checker 266 and the data port 265 responsive to a received DDR clock signal 227.

Upon startup of the devices 250, 260, a process may be initiated to configure the phase alignment of the data and clock outputs at each device 250, 260. An example alignment process is described below with reference to FIG. 3A. Once alignment is complete, the devices 250, 260 may proceed to exchange normal data communications. In such operation, the control unit 290 controls multiplexers 251, 262, and demultiplexers 252, 261 to select the respective data output drivers 287, 277 and data ports 255, 265 to transmit and receive data signals, respectively. In data transmission from the SDR device 250 to the DDR device 260, the data driver 287 provides an output data signal 222. The timing and synchronization circuit 285 clocks the data driver 287 and provides the SDR clock output 225, thereby controlling the data output signal 222 to be source synchronous with the SDR clock 225. A clock down-converter 220, including a clock divider and a phase-locked loop (PLL), receives the SDR clock 225 and generates a clock (not shown) having a frequency lower (e.g., ½ frequency) than the SDR clock 225, and having a phase aligned relative to the SDR clock 225. A phase controller 221 adjusts the phase of this clock according to a phase alignment process, outputting the DDR clock signal 227. The timing controller 270 at the DDR device 260 receives the DDR clock 227 and clocks the data port 265 to capture the received data signal 222. The data port 265 thus captures data based on the received DDR clock 227. Moreover, the clock down-converter 220 and phase controller 221 provide the DDR clock 227 having a phase controlled with respect to the phase of the data signal 222. As a result, the data signal 222 and DDR clock 227 are received at the DDR device 260 in a manner consistent with source-synchronous transmission. Timing diagrams representing example DDR, SDR and data signals are described below with reference to FIGS. 4a and 4b.

In data transmission from the DDR device 260 to the SDR device 250, the data driver 277 provides an output data signal 212. The timing and synchronization circuit 275 clocks the data driver 277 and provides the DDR clock output 215, thereby controlling the data output signal 212 to be source synchronous with the DDR clock 215. A clock up-converter 210, including a clock multiplier and a PLL, receives the DDR clock 215 and generates a clock (not shown) having a frequency higher (e.g., a doubled frequency) than the DDR clock 215, and having a phase aligned relative to the DDR clock 215. A phase controller 211 adjusts the phase of this clock according to a phase alignment process, outputting the SDR clock signal 217. The timing controller 280 at the SDR device 250 receives the SDR clock 217 and clocks the data port 255 to capture the received data signal 212. The data port 255 thus captures data based on the received SDR clock 217. Moreover, the clock up-converter 210 and phase controller 211 provide the SDR clock 217 having a phase controlled with respect to the phase of the data signal 212. As a result, the data signal 212 and SDR clock 217 are received at the SDR device 250 in a manner consistent with source-synchronous transmission.

Figure 3A:
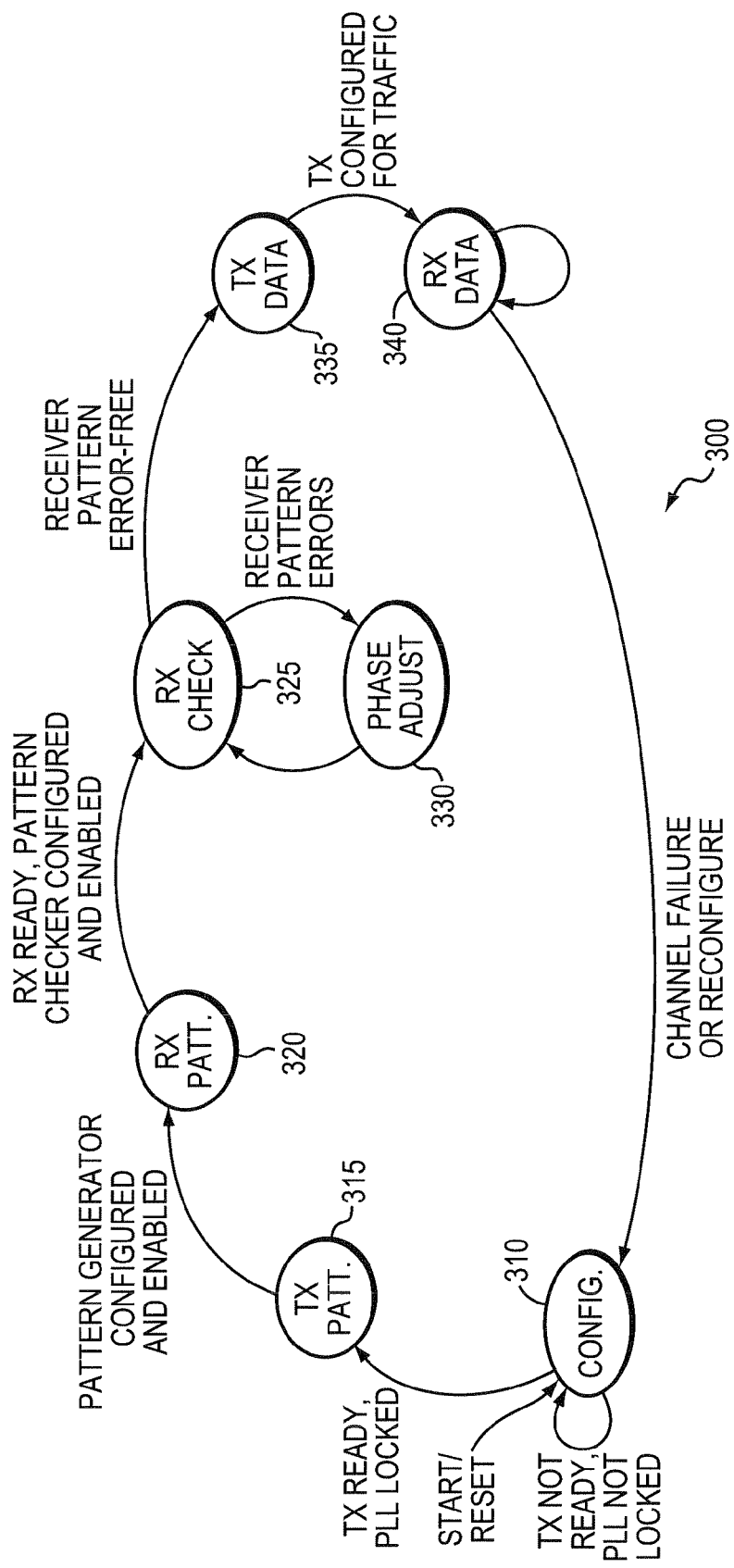
FIG. 3A is a flow diagram of a process of configuring a clock alignment between two devices.

FIG. 3A is a flow diagram of a process of configuring a clock and data alignment between two devices. With reference to FIG. 2, for example, if the timing requirements at the data and clock ports are not guaranteed to be met by design, then an initial alignment procedure and phase adjustment may be implemented to correct for variations in the relative phase between the clock and data signals. Such a procedure and adjustments may enable a proper clock/data timing relationship at a receiver by adjusting the clock phase. Particularly in transmission from the DDR device 260 to the SDR device 250, a single data rate clock generated from the DDR clock 215 could be 180° out of phase from the desired clock/data timing relationship. In this case the clock can be shifted by 180° or logically inverted. To facilitate clock phase adjustment, pattern generators 276, 286 and pattern checkers 256, 266 may be used to verify the clock/data relationship.

As provided in FIG. 3A and with reference to FIG. 2, for example, at system startup, the devices 250, 260 enter an initial configuration (310). The control unit 290 controls the multiplexers 251, 261 to select the alignment pattern generator 286 output and the alignment pattern checker 266 input, respectively. As a result, the SDR device 250 is maintained in an initial state in which operational data transmission (i.e., via data port 287) is disabled. Once the down-converter 220 PLL has achieved a lock and the pattern generator 286 is initialized, the pattern generator transmits a pattern at data output 222 (315), which is received by the DDR device 260 (320). The pattern may be a predetermined, pseudo-random sequence that is anticipated by the alignment pattern checker 266 at the DDR device 260. The alignment pattern checker 266 therefore evaluates the received pattern by comparing it against the anticipated pattern (325). The alignment pattern checker 266 is clocked by the timing controller 270 based on the received DDR clock 227; thus, a successful alignment check depends on the DDR clock 227 having a correct phase. If the alignment pattern checker 266 detects errors in the received pattern, then the timing controller 270 controls the phase controller 221 to adjust the phase of the DDR clock 227 (330). This procedure (325, 330) may be repeated until the alignment pattern checker 266 evaluates a received pattern without errors. Alternatively, the procedure may be repeated to determine a plurality of phase adjustments (at phase controller 221) at which a pattern is received without errors. This plurality of phase adjustments may be defined as a range or "window" of valid operating phases, from which one phase adjustment at or near the center of the "window" can be selected to provide a phase adjustment having greater tolerance.

Once the alignment pattern is transmitted successfully, the phase controller 221 maintains its phase adjustment to the DDR clock 227 for successive operation, and the control unit 290 enables the data driver 287 (335) and the data port 265 (340). The SDR device 250 may then resume normal operation by transmitting a data output 222 from the data driver 287. The clock down-converter 220 and phase controller 221, providing the selected phase adjustment, controls the DDR clock 227 to have proper alignment with the data output 222 when received at the DDR device 260. The alignment procedure described above may also be applied, simultaneously or independently, to the DDR device 260 output and clock up-converter 210, thereby providing a data output 212 and a SDR clock 217 controlled to be aligned at the SDR device 250.

Figure 3B:
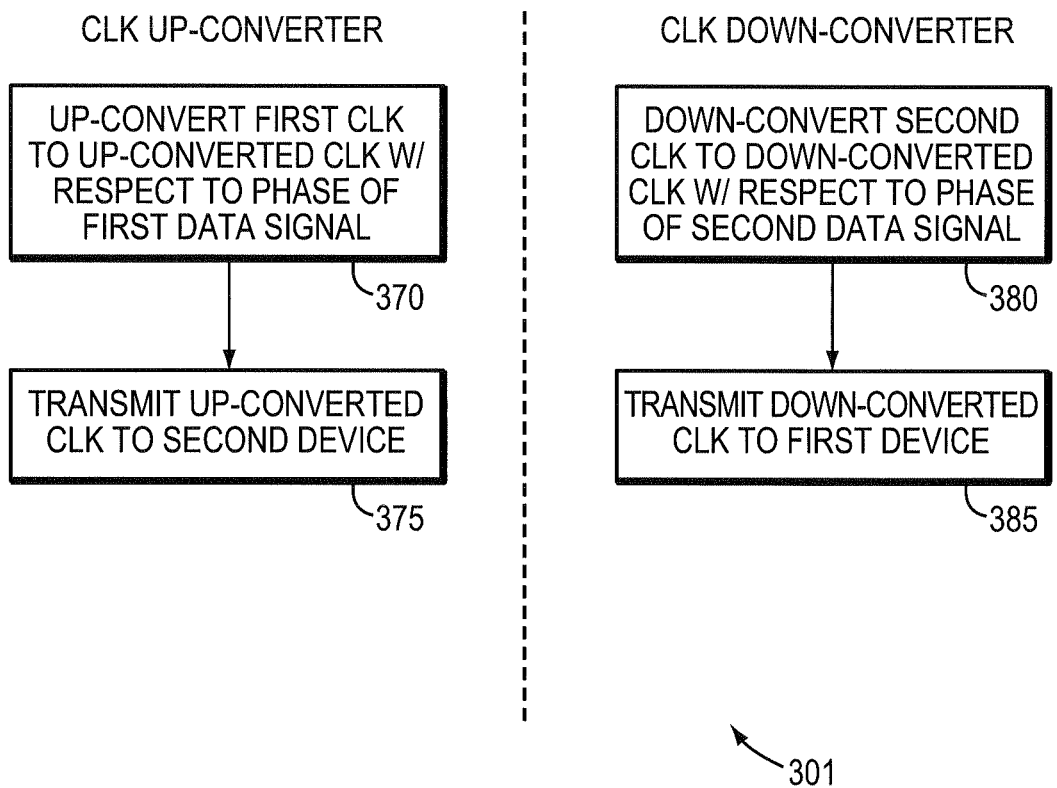
FIG. 3B is a flow diagram of a process of converting clock signals between devices in an embodiment of the present invention.

FIG. 3B is a flow diagram of a process 301 of converting clock signals between devices in an embodiment of the present invention. The process 301 may be completed by a communications system such as those described above with reference to FIGS. 1A, 1b and 2. A clock up-converter receives a first clock signal from a first device, and up-converts the first clock signal to an up-converted clock signal having a phase with respect to the phase of a first data signal (370). The clock up-converter transmits the up-converted clock signal to a second device (375). Similarly, a clock down-converter receives a second clock signal from the second device, and down-converts the second clock signal to a down-converted clock signal having a phase with respect to the phase of a second data signal (380). The clock down-converter then transmits the down-converted clock signal to the first device (385).

Figure 4A:
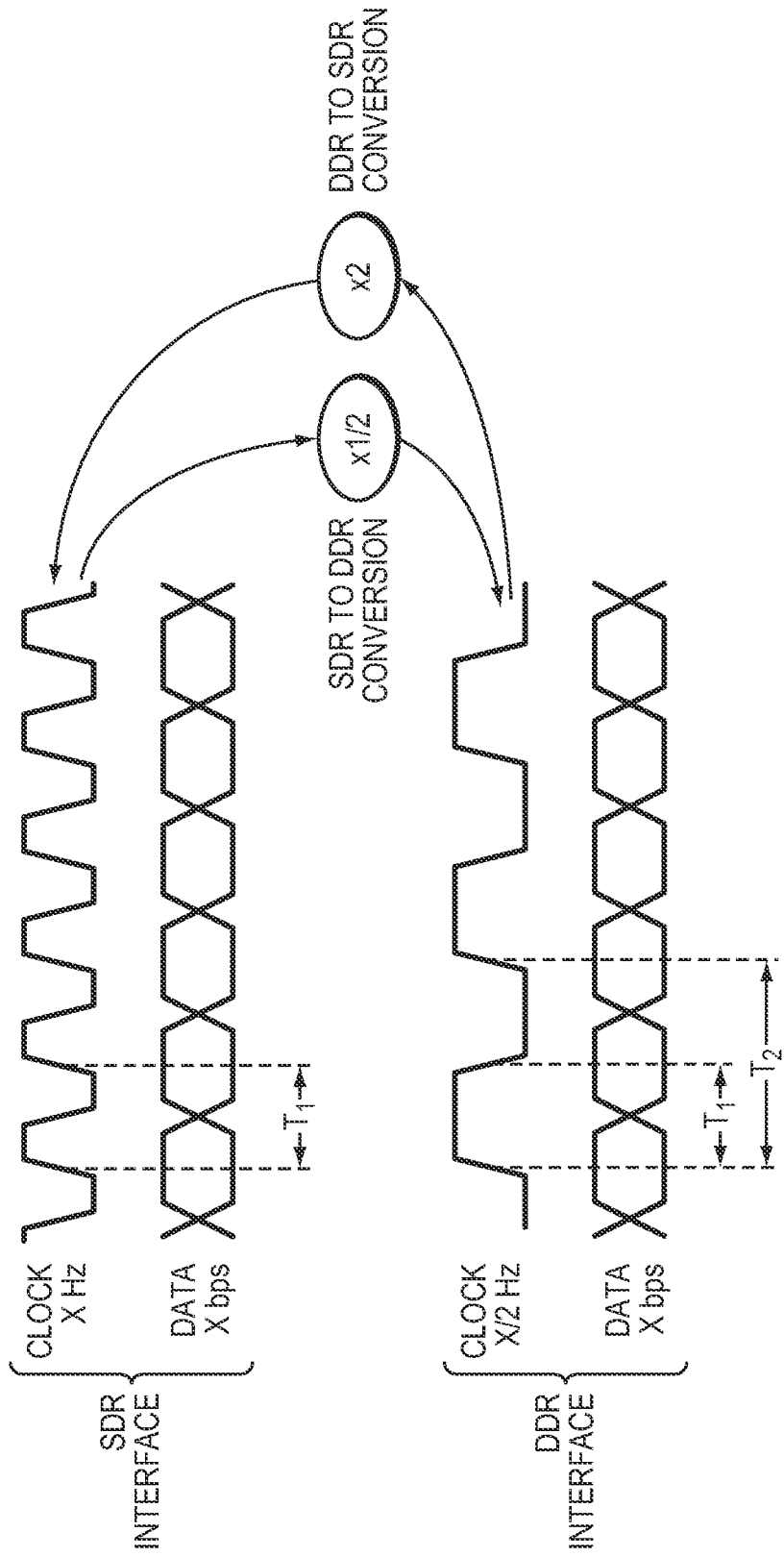
FIG. 4A is a timing diagram of clock and data signals provided by embodiments of the present invention.

FIG. 4A is a timing diagram of clock and data signals consistent with source-synchronous SDR and DDR interfaces. An SDR source-synchronous interface includes a clock signal having a period (T1), and frequency (in Hz) equal to the data rate (in bits-per-second) of an associated data signal, where the rising edge of each clock signal occurs at the center of each data signal state. In contrast, the DDR source-synchronous interface includes a clock signal having a period (T2), and frequency (in Hz) equal to ½ the data rate of an associated data signal, where both the rising and falling edge of each clock transition occurs at the center of a data signal state. Thus, in order to convert a DDR interface to an SDR interface for a given data transfer rate, the DDR clock must be multiplied (×2). Likewise, to convert a SDR interface to a DDR interface for a given transfer rate, the SDR clock must be divided by 2. Yet in the case of both such conversions, the phase of the converted clock signal may be controlled based on the associated data signal, thereby ensuring clock transitions consistent with the source-synchronous interfaces as illustrated.

Figure 4B:
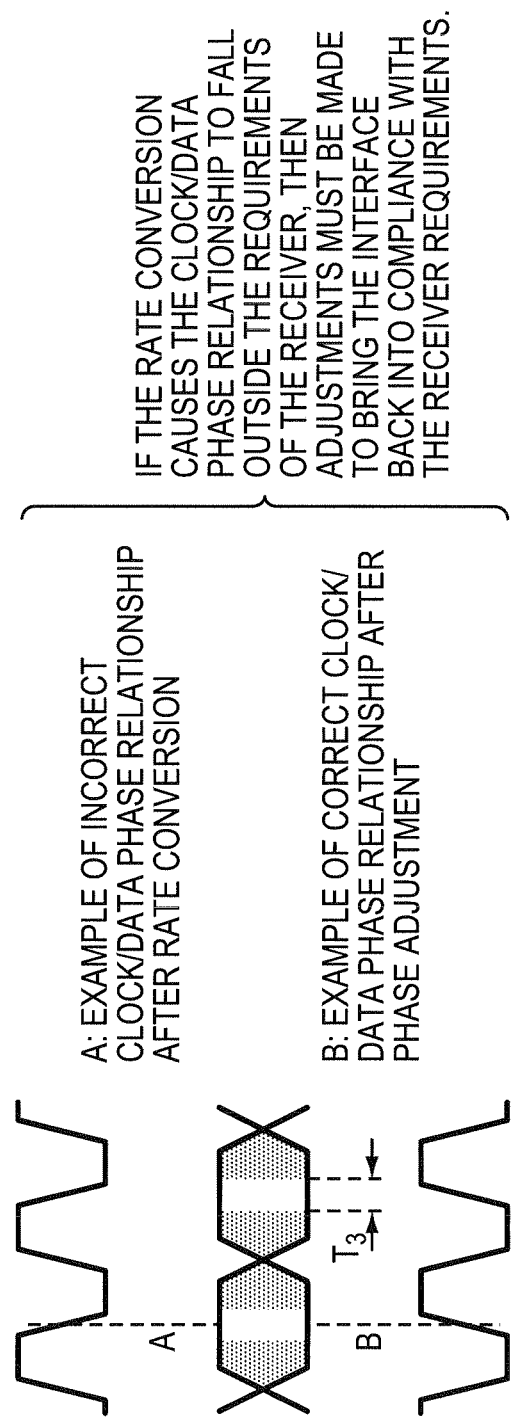
FIG. 4B is a timing diagram illustrating alignment tolerance between data and clock signals.

FIG. 4B is a timing diagram illustrating alignment tolerance between data and clock signals. Clock signals A and B illustrate correct and incorrect clock/data phase relationships with respect to the data signal at center. Clock signal A includes a falling edge (rather than a rising edge) occurring within the valid sampling window (T3) of a state of the data signal, thereby failing to clock the state of the data signal. Such an error may be corrected during clock conversion by inverting the clock signal. Clock signal B, for example, includes a rising edge occurring within the valid sampling window (T3) of the data signal, thereby enabling a receiving device to clock the state of the data signal without error. During an alignment process such as the process 300 described above with reference to FIG. 3A, the phase of a converted clock signal may be adjusted to ensure that only a valid edge of the clock signal (e.g., rising edge of a SDR clock, or both a rising and falling edge of a DDR clock) occurs within the valid sampling window (T3) of an associated data signal. Further, the alignment process may be repeated, as described above, to determine a phase adjustment to center the converted clock edge within the valid sampling window.

It should be understood that the block diagrams of FIGS. 1A-B and 2 and the flow diagrams of FIGS. 3A-B are examples that can include more or fewer components, be partitioned into subunits, or be implemented in different combinations. Moreover, the flow diagrams and components of the block diagrams may be implemented in hardware, firmware, or software. If implemented in software, the software may be written in any software language suitable for use in communications devices as illustrated in FIG. 2. The software may be embodied on any form of computer readable medium, such as RAM, ROM, or magnetic or optical disk, and loaded and executed by generic or custom processor(s).

While this invention has been particularly shown and described with references to example embodiments thereof, it will be understood by those skilled in the art that various changes in form and details may be made therein without departing from the scope of the invention encompassed by the appended claims.

What is claimed is:

1. An apparatus for converting a data interface format to enable data exchange between devices operating at different clock rates, the apparatus comprising:
    a clock up-converter configured to derive an up-converted clock signal from a first clock signal at a first clock rate of a first device and to transmit the up-converted clock signal to a second device, the up-converted clock signal having a phase controlled with respect to a phase of an associated first data signal;
    a clock down-converter configured to derive a down-converted clock signal from a second clock signal at a second clock rate of the second device and to transmit the down-converted clock signal to the first device, the down-converted clock signal having a phase controlled with respect to a phase of an associated second data signal, the second clock rate being different from the first clock rate; and
    a controller configured to align the up-converted and down-converted clock signals with the associated first and second data signals at startup of the first and second devices by causing the devices to transmit alignment patterns and adjust phases of the derived up-converted and down-converted clock signals as a function of the alignment patterns.

2. The apparatus of claim 1, wherein the controller is further configured to generate control signals to control the respective phases of the up-converted and down-converted clock signals based on relative phases of the first and second clock signals with respect to the associated first and second data signals.

3. The apparatus of claim 1, wherein the controller is further configured to enable data output of the first and second devices associated with the first and second clock signals if alignment is achieved.

4. The apparatus of claim 1, wherein the controller, in an event of a failure to achieve alignment, is further configured to report the failure and maintain the first and second devices in a pre-determined state.

5. The apparatus of claim 1, wherein the alignment patterns are pseudorandom patterns.

6. The apparatus of claim 1, wherein the controller is further configured to invert the phase of at least one of the up-converted and down-converted clock signals to align a leading or trailing edge with a feature of the respective associated first or second data signal.

7. The apparatus of claim 1, wherein each of the clock up-converter and the clock down-converter employs a phase-locked loop (PLL).

8. The apparatus of claim 7, wherein the PLL employed by the clock up-converter includes a multiplier and the PLL employed by the clock down-converter includes a divider.

9. The apparatus of claim 1, wherein the first device includes a double-data rate (DDR) interface, and the second device includes a single-data rate (SDR) interface.

10. A method of converting a data interface format to enable data exchange between devices operating at different clock rates, the method comprising:
   up-converting a first clock signal at a first clock rate from a first device to an up-converted clock signal, the up-converted clock signal having a phase controlled with respect to a phase of an associated first data signal;
   down-converting a second clock signal at a second clock rate from a second device to a down-converted clock signal, the down-converted clock signal having a phase controlled with respect to a phase of an associated second data signal, the second clock rate being different from the first clock rate;
   transmitting the up-converted and down-converted clock signals respectively to the second and first devices;
   causing the first and second devices to transmit alignment patterns to align the up-converted and down-converted clock signals with the associated first and second data signals at startup of the first and second devices; and
   adjusting phases of the up-converted and down-converted clock signals as a function of the alignment patterns.

11. The method of claim 10, further comprising generating control signals to control the respective phases of the up-converted and down-converted clock signals based on relative phases of the first and second clock signals with respect to the associated first and second data signal.

12. The method of claim 10, further comprising enabling data output of the first and second devices associated with the clock signals if alignment is achieved.

13. The method of claim 10, further comprising, in an event of a failure to achieve alignment, reporting the failure and maintaining the first and second devices in a pre-determined state.

14. The method of claim 10, wherein the alignment patterns are pseudorandom patterns.

15. The method of claim 10, further comprising inverting the phase of at least one of the up-converted and down-converted clock signals to align a leading or trailing edge with a feature of the respective associated first or second data signal.

16. The method of claim 10, wherein the up-converting and the down-converting include controlling a phase-locked loop (PLL).

17. The method of claim 16, wherein up-converting the first clock signal includes multiplying the first clock signal, and down-converting the second clock signal includes dividing the second clock signal.

18. The method of claim 10, wherein the first device includes a double-data rate (DDR) interface, and the second device includes a single-data rate (SDR) interface.

* * * * *